(12) United States Patent
Cho et al.

(10) Patent No.: US 7,655,161 B2
(45) Date of Patent: Feb. 2, 2010

(54) CONDUCTIVE INK COMPOSITION FOR INKJET PRINTING

(75) Inventors: Hye-Jin Cho, Seoul (KR); Jae-Woo Joung, Suwon-si (KR); Sung-Il Oh, Seoul (KR); Tae-Hoon Kim, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 356 days.

(21) Appl. No.: 11/655,832

(22) Filed: Jan. 22, 2007

(65) Prior Publication Data

US 2007/0289483 A1    Dec. 20, 2007

(30) Foreign Application Priority Data

Jun. 14, 2006   (KR) ...................... 10-2006-0053630

(51) Int. Cl.
  *H01B 1/22* (2006.01)
(52) U.S. Cl. ...................... 252/512; 252/514
(58) Field of Classification Search ......... 252/512–514; 106/1.21
See application file for complete search history.

(56) References Cited

U.S. PATENT DOCUMENTS

| | | | |
|---|---|---|---|
| 6,881,239 B2 * | 4/2005 | Uchida | 75/252 |
| 7,445,731 B2 * | 11/2008 | Okada et al. | 252/512 |
| 2003/0145680 A1 * | 8/2003 | Uchida | 75/252 |
| 2007/0281136 A1 * | 12/2007 | Hampden-Smith et al. | 428/195.1 |
| 2008/0041269 A1 * | 2/2008 | Bogale et al. | 106/31.27 |
| 2008/0192667 A1 * | 8/2008 | Wandel | 370/311 |

FOREIGN PATENT DOCUMENTS

| | | |
|---|---|---|
| CN | 1201057 A | 12/1998 |
| CN | 1660597 A | 8/2005 |
| KR | 10-2005-0085708 | 8/2005 |
| KR | 10-2006-0017686 | 2/2006 |
| KR | 2006-17686 | 2/2006 |
| KR | 2006-41698 | 5/2006 |

OTHER PUBLICATIONS

Chinese Office Action issued Aug. 14, 2009 in corresponding Chinese Patent Application 2007100798079.

* cited by examiner

*Primary Examiner*—Mark Kopec
(74) *Attorney, Agent, or Firm*—Staas & Halsey LLP

(57) ABSTRACT

A conductive ink composition for inkjet printing, more particularly to a conductive ink composition for inkjet printing, which includes 30 to 85 parts by weight of metal nanoparticles, 10 to 60 parts by weight of an organic solvent, 10 to 30 parts by weight of a humectant, the humectant made of a diol or glycol base compound, and 0.1 to 10 parts by weight of an ethylene glycol-based ether compound additive for adjusting viscosity. The ink composition may be optimized, such that the viscosity of the ink may be adjusted while maintaining a high concentration of metal, when forming wiring using an inkjet device, for improved flow and ejection properties of the ink.

7 Claims, No Drawings

CONDUCTIVE INK COMPOSITION FOR INKJET PRINTING

CROSS-REFERENCE TO RELATED APPLICATIONS

This application claims the benefit of Korean Patent Application No. 10-2006-0053630 filed with the Korean Intellectual Property Office on Jun. 14, 2006, the disclosure of which is incorporated herein by reference in its entirety.

BACKGROUND

1. Technical Field

The present invention relates to a conductive ink composition for inkjet printing, more particularly to a conductive ink composition for inkjet printing, which has a high concentration of metal, and in which the viscosity is adjusted for improved flow and ejection properties of the ink.

2. Description of the Related Art

Along with recent advances in industrial technology, the rapid development of the IT industry, including the field of mobile communications, is creating a demand for electronic products and data communication devices that are smaller and lighter for convenient portability, and yet are equipped with more functionalities. In accordance with these trends, together with the ongoing efforts to develop various components that are smaller, lighter, more integrated, and have more improved functions, there are also endless demands, such as in the RoHS directive of Europe, for the development of clean production technology, which does not generate toxic materials. In response to these demands, there are developments in various fields of technology, among which is the inkjet printing technology.

The ink for inkjet printing in conventional techniques was mostly of a composition for pigment ink used in regular photograph printing. Since, in the case of pigment ink, the weight of the solid particles is of a lower percentage compared to the weight of the entire ink, the majority of ink preparing techniques concentrate on ejection and color characteristics, rather than on considerations regarding property changes due to high viscosity. However, in the case of conductive ink for inkjet printing, an ink of a high viscosity that has a metal content above a certain value is required in order to provide a thickness that enables its use as metal wiring. However, with higher values of metal content, the viscosity of the conductive ink is raised excessively above a particular level, to render inkjet ejection impossible. Thus, for improved resolution and printing quality in inkjet printing, there is a demand for the development of an ink which allows high-concentration ejection, by adjusting the surface tension and viscosity of the ink.

SUMMARY

An aspect of the invention aims to provide a conductive ink composition for inkjet printing, in which the viscosity of the ink can be maintained at a low level while maintaining a high concentration of metal, for an improved flow property of the ink, when preparing a conductive ink composition for inkjet printing using metal nanoparticles synthesized in a water base.

One aspect of the invention provides a conductive ink composition, which includes 30 to 85 parts by weight of metal nanoparticles, 10 to 60 parts by weight of an organic solvent, 10 to 30 parts by weight of a humectant, the humectant made of a diol or glycol base compound, and 0.1 to 10 parts by weight of an ethylene glycol-based ether compound additive for adjusting viscosity.

The metal nanoparticles may be nanoparticles of any one or more metals selected from a group consisting of silver (Ag), gold (Au), copper (Cu), nickel (Ni), palladium (Pd), platinum (Pt), and alloys thereof. The particle size of the metal nanoparticles may be 20 to 50 nm.

In one embodiment, the metal nanoparticles may be capped with any one or more dispersants selected from a group consisting of poly(vinyl pyrrolidone) (PVP), polyacids, and derivatives thereof.

Here, the polyacids include any one or more selected from poly(acrylic acid), poly(maleic acid), poly(methylmethacrylate), poly(acrylic acid-co-methacrylic acid), poly(maleic acid-co-acrylic acid), and poly(acrylamide-co-acrylic acid), and the derivatives include any one or more selected from a group consisting of a sodium salt, potassium salt, and ammonium salt of the polyacid. It may further be desirable that the metal nanoparticles be silver (Ag) nanoparticles capped with poly(vinyl pyrrolidone) (PVP).

The organic solvent may be any one or more selected from a group consisting of water, ethanol, methanol, propanol, isopropanol, 1-butanol, 2-butanol, isobutanol, hexanol, and oxanol.

Also, the humectant may be any one or more selected from a group consisting of 1,2-hexanediol, diethylene glycol, triethylene glycol, ethylene glycol, propylene glycol, dipropylene glycol, glycerin, polyethylene glycol, and hexylene glycol.

Furthermore, the additive may be any one or more selected from a group consisting of triethyleneglycol dimethyl ether, triethyleneglycol monobutyl ether, triethyleneglycol monoethyl ether, diethyleneglycol diethyl ether, diethyleneglycol monobutyl ether, diethyleneglycol dibutyl ether, ethyleneglycol monopropyl ether, and dipropyleneglycol methyl ether.

DETAILED DESCRIPTION

The conductive ink composition for inkjet printing according to certain embodiments of the invention will be described below in more detail.

In order to form wiring using an inkjet device, it is necessary to prepare an ink that can be continuously ejected from an inkjet head. An appropriate ink viscosity in the inkjet head for continuous ink ejection is below about 20 cp. However, a high-concentration ink having a metal content above a certain value is required in order to obtain the thickness of the metal wiring, and a humectant is necessarily included to control drying at the nozzles, and as the viscosity is increased due to the metal and humectant content, higher concentrations of metal cause an excessive rise in viscosity, rendering inkjet ejection impossible. Thus, one aim of the invention is to optimize the composition of conductive ink such that the viscosity is lowered while a high concentration of metal is maintained, to allow ejection at the inkjet head.

A conductive ink composition for inkjet printing according to an embodiment of the invention includes 30 to 85 parts by weight of metal nanoparticles, 10 to 60 parts by weight of an organic solvent, 10 to 30 parts by weight of a humectant, the humectant made of a diol or glycol base compound, and 0.1 to 10 parts by weight of an ethylene glycol-based ether compound additive for adjusting viscosity.

The metal nanoparticles used in a conductive ink composition according to an embodiment of the invention are made of nanoparticles of any one or more metals selected from a group consisting of silver (Ag), gold (Au), copper (Cu), nickel (Ni), palladium (Pd), platinum (Pt), and alloys thereof.

Here, the particle size of the metal nanoparticles may be 20 to 50 nm. The smaller the size of the particles, the easier the ejection of the metal ink, where particles of 50 nm or smaller may be more advantageous in forming drops for inkjet ejection This use of using nano-size metal allows an improved ejection property of the ink and allows low-temperature curing.

In one embodiment, the metal nanoparticles may be capped with any one or more dispersants selected from a group consisting of poly(vinyl pyrrolidone) (PVP), polyacids, and derivatives thereof.

Here, the polyacids include any one or more selected from poly(acrylic acid), poly(maleic acid), poly(methylmethacrylate), poly(acrylic acid-co-methacrylic acid), poly(maleic acid-co-acrylic acid), and poly(acrylamide-co-acrylic acid), and the derivatives include any one or more selected from a group consisting of a sodium salt, potassium salt, and ammonium salt of the polyacid.

A specific example that may be used as the metal nanoparticles are silver (Ag) nanoparticles capped with poly(vinyl pyrrolidone) (PVP). The silver (Ag) nanoparticles capped with poly(vinyl pyrrolidone) (PVP) may be prepared using a liquid phase method, such as that disclosed in Korean Patent Application no. 10-2005-85708, for example. That is, a reducing agent and the capping molecules are first mixed, such as ethylene glycol and poly(vinyl pyrrolidone), and this mixture is mixed and reacted with a mixed solution of a metal precursor and an alcohol-based compound, after which the nanoparticles may be prepared by adding acetone and ethylene glycol.

In the conductive ink composition according to certain aspects of the invention, it is desirable that the content of the metal nanoparticles be 30 to 85 parts by weight. If the content is below 30 parts by weight, the metal content is insufficient, so that there is less variety in the utility of the ink as wiring and its use is limited, whereas if the content is higher than 85 parts by weight, the viscosity is too high, so that the ejection property of the ink is degraded and the ink becomes unsuitable for a metal ink. It may further be desirable that the metal content be 50 to 60 parts by weight, in order to maintain a high concentration of metal while allowing easy flowing of the ink.

The organic solvent used in a conductive ink composition according to an embodiment of the invention is a hydrophilic solvent, specific examples of which include but are not limited to water, ethanol, methanol, propanol, isopropanol, 1-butanol, 2-butanol, isobutanol, hexanol, and oxanol. The organic solvent may be one of the hydrophilic solvents used alone or may be a two or more solvents used as a mixture. Here, it may be desirable that the content of the organic solvent used in an embodiment of the invention be 10 to 50 parts by weight. If the content is below 10 parts by weight, the drying speed of the inkjet head is too fast, and nozzle blockage may occur, whereas if the content is higher than 50 parts by weight, the viscosity is too high, and the ink is not freely ejected. It may further be desirable that the metal content be 15 to 40 parts by weight.

In the conductive ink according to an embodiment of the invention, a humectant is used to adjust the drying speed at the inkjet head and maintain humidity, because the alcohol-based solvents used as the organic solvent have an excessively low boiling point and thus incur severe drying. The humectant used in an embodiment of the invention may be a diol or glycol base compound, which includes, but is not limited to, one or more selected from a group consisting of 1,2-hexanediol, diethylene glycol, triethylene glycol, ethylene glycol, propylene glycol, dipropylene glycol, glycerin, polyethylene glycol, and hexylene glycol. When using glycerin, the commercially available products of EG1 and EG7, etc., may be used, where ethylene oxide is added in a proportion of 26 moles in EG1, and ethylene oxide is added in a proportion of 7 moles in EG7.

Here, it may be desirable that the content of the humectant be 10 to 30 parts by weight. If the content is below 10 parts by weight, the drying speed of the inkjet head is too fast, and nozzle blockage may occur, whereas if the content is higher than 30 parts by weight, the viscosity is too high, and the ink is not freely ejected.

Also, additives may be used in a conductive ink composition according to an embodiment of the invention for adjusting the viscosity of the ink to an appropriate level. An additive used in an embodiment of the invention may be an ethylene glycol-based ether or a compound comprising it. An ethylene glycol-based ether can not only stabilize metal nanoparticles, by means of the ether group which contains an unshared electron pair, to allow the stable use of high-concentration metal nanoparticles, but can also maintain an appropriate viscosity in the inkjet head when using inkjet printing to form wiring, for improved flow and ejection properties of the ink. Specific examples of the ethylene glycol-based ether include, but are not limited to, triethyleneglycol dimethyl ether, triethyleneglycol monobutyl ether, triethyleneglycol mono ethyl ether, diethyleneglycol diethyl ether, diethyleneglycol monobutyl ether, diethyleneglycol dibutyl ether, ethyleneglycol monopropyl ether, and dipropyleneglycol methyl ether, etc., where any one of these may be used alone or two or more additives may be used as a mixture.

In an embodiment of the invention, it may be desirable that these additives be used in 0.1 to 30 parts by weight. If the content is below 0.1 parts by weight, the adjusting of the viscosity is not readily achieved, whereas if the content is higher than 30 parts by weight, the stability of the particles is degraded, and problems occur in compatibility between solvents. Aspects of the invention will be described below in more detail by means of embodiment examples of the invention, where the examples are for illustrative purposes only and are not intended to limit the invention.

EMBODIMENT EXAMPLES 1~3

Conductive ink compositions were prepared by mixing each component according to the content listed in Table 1 below. Here, the silver nanoparticles used were capped with PVP and had particle sizes of below 50 nm, and were prepared by a method such as that disclosed in Korean Patent Application no. 10-2005-085708.

The properties of the prepared conductive ink compositions are listed in Table 1. In Table 1 below, the content of each component is described in parts by weight.

COMPARATIVE EXAMPLES 1~3

Conductive ink compositions were prepared according to the components and contents listed in Table 1 below. Properties of the prepared conductive ink compositions were measured and are listed together in Table 1.

TABLE 1

|  |  | Embodiment Example | | | Comparative Example | | |
| --- | --- | --- | --- | --- | --- | --- | --- |
|  |  | 1 | 2 | 3 | 1 | 2 | 3 |
| Silver Nanoparticles | | 50 | 50 | 50 | 30 | 50 | 50 |
| Organic Solvent | Water | 5 | 5 | 5 | — | — | 5 |
|  | Ethanol | 25 | 25 | 25 | 70 | 50 | 25 |
| Humectant | Glycerin | 7.5 | 6.6 | — | — | — | — |
|  | 1,2-Hexanediol | 7.5 | 6.6 | — | — | — | — |
|  | Dipropylene Glycol | — | — | 10 | — | — | 10 |
|  | Diethylene Glycol | — | — | 10 | — | — | 10 |
| Additive | Diethylene Glycol Dibutyl Ether | 5 | 6.6 | — | — | — | — |
|  | Dipropylene Glycol Monobutyl Ether | — | — | 1 | — | — | — |
| Viscosity (at 60 rpm)(cp) | | 14.4 | 15.5 | 6.8 | 6.5 | 13.6 | 19.2 |
| Surface Tension (dyne/cm) | | 29.3 | 29.7 | 27 | 30.3 | 35.6 | 29.3 |
| Printing Results | | ○ | Δ | ○ | X | X | ○ |

In the table 1, the symbol of 'O' means average and 'X' means that the ejection property of the ink is excellent and the symbol of 'Δ' means average and 'X' means poor.

Property Measurement Methods a) Viscosity: measured using a Brookfield viscometer (DV-III+)

b) Surface Tension: measured using a Ring Tension meter measurement equipment from KRUSS company (K-9)

c) Printing Results: printing tested using printing apparatus equipped with a Spectra SE head As seen from the results of Table 1, with the conductive ink composition for inkjet printing according to embodiments of the invention, a viscosity suitable for inkjet printing can be maintained by including a diol or glycol based humectant and additives of ethylene glycol-based ether within an appropriate range, when using an alcohol-based hydrophilic solvent to prepare a high-concentration conductive ink, for improved flow properties of the ink and superior printing results.

According to aspects of the invention as set forth above, the conductive ink composition for inkjet printing has an optimized composition such that allows a high-concentration ink preparation, whereby a viscosity suitable for inkjet printing may be obtained, and the flow and ejection properties of the ink may be improved, when forming wiring using inkjet printing.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A conductive ink composition comprising:
   30 to 85 parts by weight of metal nanoparticles, wherein the particle size of the metal nanoparticles is 20 to 50 nm, and the metal nanoparticles are capped with any one or more dispersants selected from the group consisting of poly(vinyl pyrrolidone) (PVP), polyacids, and derivatives thereof;
   10 to 60 parts by weight of solvent, wherein the solvent is a water or alcohol-based solvent;
   10 to 30 parts by weight of a humectant, the humectant made of a diol or glycol base compound; and
   0.1 to 10 parts by weight of an additive for adjusting viscosity, the additive made of an ethylene base ether compound.

2. The conductive ink composition of claim 1, wherein the metal nanoparticles are nanoparticles of any one or more metals selected from the group consisting of silver (Ag), gold (Au), copper (Cu), nickel (Ni), palladium (Pd), platinum (Pt), and alloys thereof.

3. The conductive ink composition of claim 1, wherein the polyacids include any one or more selected from the group consisting of poly(acrylic acid), poly(maleic acid), poly (methylmethacrylate), poly(acrylic acid-co-methacrylic acid), poly(maleic acid-co-acrylic acid), and poly(acrylam ide-co-acrylic acid), and the derivatives including any one or more selected from the group consisting of a sodium salt, potassium salt, and ammonium salt of the polyacid.

4. The conductive ink composition of claim 1, wherein the metal nanoparticles are silver (Ag) nanoparticles capped with poly(vinyl pyrrolidone) (PVP).

5. The conductive ink composition of claim 1, wherein the alcohol-based solvent is any one or more selected from the group consisting of ethanol, methanol, propanol, isopropanol, 1-butanol, 2-butanol, isobutanol, hexanol, and oxanol.

6. The conductive ink composition of claim 1, wherein the humectant is any one or more selected from the group consisting of 1,2-hexanediol, diethylene glycol, triethylene glycol, ethylene glycol, propylene glycol, dipropylene glycol, glycerin, polyethylene glycol, and hexylene glycol.

7. The conductive ink composition of claim 1, wherein the additive is any one or more selected from athe group consisting of triethyleneglycol dimethyl ether, triethyleneglycol monobutyl ether, triethyleneglycol monoethyl ether, diethyleneglycol diethyl ether, diethyleneglycol monobutyl ether, diethyleneglycol dibutyl ether, ethyleneglycol monopropyl ether, and dipropyleneglycol methyl ether.

* * * * *

UNITED STATES PATENT AND TRADEMARK OFFICE
CERTIFICATE OF CORRECTION

| | |
|---|---|
| PATENT NO. | : 7,655,161 B2 |
| APPLICATION NO. | : 11/655832 |
| DATED | : February 2, 2010 |
| INVENTOR(S) | : Hye-Jin Cho et al. |

Page 1 of 1

It is certified that error appears in the above-identified patent and that said Letters Patent is hereby corrected as shown below:

Column 6, Line 27, change "poly(acrylam ide-" to --poly(acrylamide- --.

Column 6, Line 44, after "from" change "athe" to --the--.

Signed and Sealed this

First Day of June, 2010

David J. Kappos
*Director of the United States Patent and Trademark Office*